(12) United States Patent
Ouyang et al.

(10) Patent No.: US 11,980,061 B2
(45) Date of Patent: May 7, 2024

(54) OLED DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Qi Ouyang, Hubei (CN); Yang Zhou, Hubei (CN); Mugyeom Kim, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 930 days.

(21) Appl. No.: 16/971,820

(22) PCT Filed: Jun. 30, 2020

(86) PCT No.: PCT/CN2020/099250
§ 371 (c)(1),
(2) Date: Aug. 21, 2020

(87) PCT Pub. No.: WO2021/237868
PCT Pub. Date: Dec. 2, 2021

(65) Prior Publication Data
US 2023/0098867 A1    Mar. 30, 2023

(30) Foreign Application Priority Data
May 28, 2020   (CN) .......................... 202010467344.9

(51) Int. Cl.
*H01L 33/00* (2010.01)
*H10K 59/122* (2023.01)
(Continued)

(52) U.S. Cl.
CPC ......... *H10K 59/122* (2023.02); *H10K 59/131* (2023.02); *H10K 71/00* (2023.02); *H10K 59/1201* (2023.02); *H10K 2102/311* (2023.02)

(58) Field of Classification Search
CPC .... H10K 59/122; H10K 59/131; H10K 71/00; H10K 59/1201; H10K 2102/311;
(Continued)

(56) References Cited

U.S. PATENT DOCUMENTS

2019/0041915 A1*  2/2019  Park .................... H10K 59/131
2020/0058887 A1   2/2020  Namkung
(Continued)

FOREIGN PATENT DOCUMENTS

CN   108154801 A   6/2018
CN   108615821 A   10/2018
(Continued)

*Primary Examiner* — Samuel Park

(57) ABSTRACT

An organic light-emitting diode (OLED) display panel and a manufacturing method thereof are provided. The OLED display panel includes a folding region and a non-folding region. The folding region includes a first flexible layer, an inorganic layer, a second flexible layer, a buffer layer, a metal wiring layer, a planarization layer, and a pixel defining layer, which are sequentially stacked. A side of the buffer layer opposite to the second flexible layer is provided with holes, and each of the holes is deposited with a first organic filling layer. The metal wiring layer covers a side of the buffer layer and the first organic filling layer, and a cross section of the first organic filling layer of the folding region is formed with a zigzag shape.

15 Claims, 4 Drawing Sheets

(51) Int. Cl.
*H10K 59/131* (2023.01)
*H10K 71/00* (2023.01)
*H10K 59/12* (2023.01)
*H10K 102/00* (2023.01)

(58) Field of Classification Search
CPC .... H10K 59/873; H10K 77/111; H10K 59/12; Y02E 10/549; H01L 23/562; H01L 27/1218; H01L 27/1244; H01L 27/1262
See application file for complete search history.

(56) References Cited

U.S. PATENT DOCUMENTS

2021/0066643 A1* 3/2021 Choi .................. H10K 50/822
2021/0111379 A1* 4/2021 Lee ..................... H10K 59/35

FOREIGN PATENT DOCUMENTS

| | | | | |
|---|---|---|---|---|
| CN | 109378339 A | 2/2019 | | |
| CN | 109659318 A | 4/2019 | | |
| CN | 109659337 A | * 4/2019 | ............. | G09F 9/301 |
| CN | 110718646 A | 1/2020 | | |
| CN | 110797377 A | 2/2020 | | |
| CN | 111029373 A | 4/2020 | | |
| CN | 111063706 A | 4/2020 | | |
| CN | 111063721 A | 4/2020 | | |
| CN | 111106150 A | 5/2020 | | |

* cited by examiner

OLED DISPLAY PANEL AND MANUFACTURING METHOD THEREOF

FIELD OF INVENTION

The present application is related to the field of display technology, and specifically, to an organic light-emitting diode (OLED) display panel and a manufacturing method thereof.

BACKGROUND OF INVENTION

Organic light-emitting diode (OLED) display panels are self-luminous, so they can display the darkest color in pure black. In terms of viewing angles, even under wide viewing angles, images of the OLED display panels stay undistorted. Also, advantages such as good color uniformity, strong anti-shatter ability, light weight, and thinness make applications of the OLED display panels more and more widespread. Pad bending is a core technology of the OLED display panels, so major businesses are developing pad bending technology to reduce a width of frames and achieve a greater screen-to-body ratio. Because a bending region of an OLED display panel is provided with a metal wiring layer, when a bending radius of the OLED display panel is relatively small, the metal wiring layer is prone to break or crack. Meanwhile, stress will also be transmitted to a thin-film encapsulation layer of a display region, which makes the display region have a risk of being intruded by water and oxygen.

Therefore, the current OLED display panels have problems of the metal wiring layer provided in the OLED display panels being prone to breakage or cracks due to the stress when the OLED display panels are bent, which may even extend to the display region and affect display quality of the OLED display panels. These problems require urgent solutions.

SUMMARY OF INVENTION

The present application is related to an organic light-emitting diode (OLED) display panel and a manufacturing method thereof, which can solve problems that when a current OLED display panel is bent, a metal wiring layer provided in the OLED display panel is prone to break or crack due to stress, which may even extend to a display region and affect display quality of the OLED display panel.

In order to solve the above problems, the present application provides technical solutions as follows.

The OLED display panel provides by the present application includes a folding region and a non-folding region. The folding region includes a first flexible layer, an inorganic layer, a second flexible layer, a buffer layer, a metal wiring layer, a planarization layer, and a pixel defining layer, which are sequentially stacked.

A side of the buffer layer opposite to the second flexible layer is provided with holes, and each of the holes is deposited with a first organic filling layer.

The metal wiring layer covers a side of the buffer layer and the first organic filling layer, and a cross section of the first organic filling layer of the folding region is formed with a zigzag shape.

According to an embodiment provided by the present application, the first flexible layer and the second flexible layer are made of polyimide or plastic.

According to an embodiment provided by the present application, a shape of the metal wiring layer is formed with a zigzag shape.

According to an embodiment provided by the present application, the first organic filling layer is a columnar array having a plurality of columns with same size and shape.

According to an embodiment provided by the present application, each of the plurality of columns has a cylindrical shape, an upright truncated cone shape, or an inverted truncated cone shape.

According to an embodiment provided by the present application, the metal wiring layer covers an upper surface and a periphery of the first organic filling layer.

According to an embodiment provided by the present application, a projection of the metal wiring layer covering each of the plurality of columns forms a circle.

According to an embodiment provided by the present application, a space with a same layer as the metal wiring layer without metal wires disposed is filled with an inorganic material.

According to an embodiment provided by the present application, the inorganic material filled in the space with the same layer as the metal wiring layer without metal wires disposed is one or a combination of silicon nitride, silicon oxide, and silicon oxynitride.

According to an embodiment provided by the present application, a side of the metal wiring layer opposite to the first flexible layer is covered with an optically transparent adhesive.

In the above OLED display panel provided by the present application, a side of the inorganic layer opposite to the first flexible layer is provided with holes, each of the holes is deposited with a second organic filling layer, and the second organic filling layer is arranged same as the first organic filling layer.

According to an embodiment provided by the present application, the second organic filling layer is parallel to and face the first organic filling layer.

According to an embodiment provided by the present application, the second organic filling layer is parallel to and offset from the first organic filling layer.

According to an embodiment provided by the present application, a shape of the metal wiring layer is formed with a zigzag shape.

According to an embodiment provided by the present application, material of the inorganic layer is one or a combination of silicon nitride, silicon oxide, and silicon oxynitride.

According to an embodiment provided by the present application, the planarization layer is disposed on a side of the metal wiring layer opposite to the first flexible layer, and the pixel defining layer is disposed on a side of the planarization layer opposite to the first flexible layer.

According to an embodiment provided by the present application, a side of the pixel defining layer opposite to the first flexible layer is provided with color resists with a plurality of colors.

The present application further provides a manufacturing method of the OLED display panel. The manufacturing method includes steps of:

S10, coating a first flexible layer and an inorganic layer sequentially;

S20, using laser to etch holes on the inorganic layer in a folding region, and depositing a first organic filling layer in the holes;

S30, depositing a second flexible layer and a buffer layer on a side of the first organic filling layer and the inorganic layer opposite to the first flexible layer;

S40, using laser to etch holes on the buffer layer in the folding region, and depositing a second organic filling layer in the holes; and S50, depositing a metal wiring layer, a planarization layer, and a pixel defining layer on a side of the second organic filling layer and the buffer layer opposite to the second flexible layer.

Compared with the prior art, the OLED display panel and the manufacturing method thereof provided by the present application have the following beneficial effects.

1. The OLED display panel provided by the present application uses laser to etch the holes on the buffer layer, deposits columnar organic filling layers in the holes, and deposits the metal wiring layer on the side of the buffer layer and the organic filling layers opposite to the first flexible layer. Hence, part of tensile stress and compressive stress generated when the metal wiring layer is bent inward offset each other. Risks of generating cracks in the OLED display panel or breakage and short-circuiting of the metal wiring layer extending to the display region of the OLED display panel are reduced, thereby preventing the display quality of the OLED display panel from being affected.

2. The OLED display panel provided by the present application also uses laser to etch the holes on the inorganic layer, and deposits columnar organic filling layers in the holes. Bending stress of the OLED display panel is further reduced, thereby preventing the display quality of the OLED display panel from being affected.

DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DETAILED DESCRIPTION OF PREFERRED EMBODIMENTS

Figure 1:
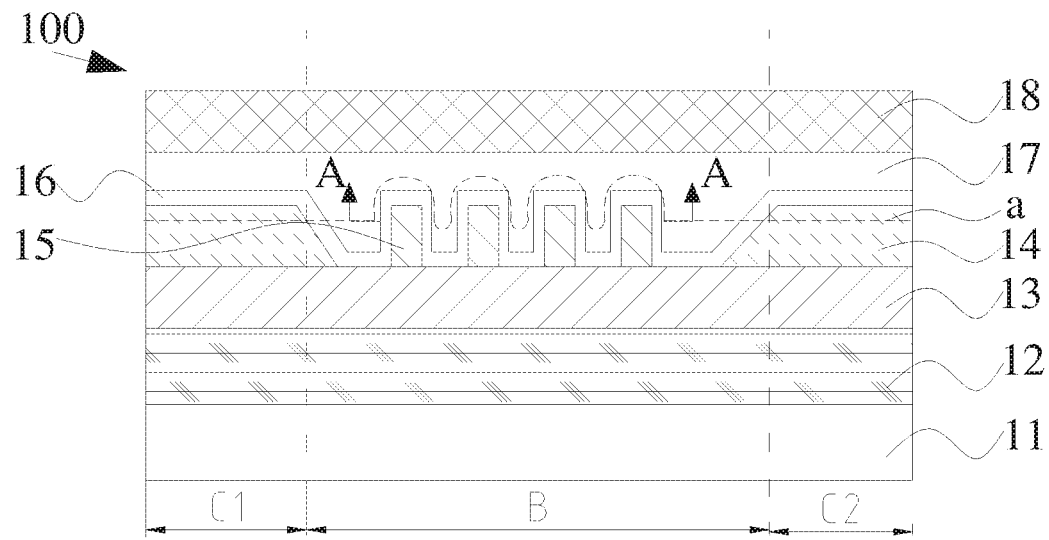
FIG. 1 is a first structural schematic diagram of an OLED display panel provided by an embodiment of the present application.

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the of the present application.

In the description of the present application, it should be explained that the terms "center", "portrait", "transverse", "length", "width", "thickness", "upper", "lower", "front", the directions or positional relationships indicated by "back", "left", "right", "vertical", "horizontal", "top", "bottom", "inside", "outside", etc. are based on the drawings. The orientation or positional relationship is only for the convenience of describing the present application and simplifying the description, and does not indicate or imply that the device or element referred to must have a specific orientation, structure and operation in a specific orientation, and should not be viewed as limitations of the present application. In addition, terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "multiple" is two or more, unless specifically defined otherwise.

In the description of the present application, it should be explained that terms "installation", "link", and "connection" should be understood broadly, unless explicitly stated and limited otherwise. For example, connection can be fixed connection or removable or integral connection, can be mechanical connection, electrical connection or mutual communication, can be direct connection or indirect connection through an intermedium, or can be the internal communication between two components or the mutual reaction between two components. For a skilled person in the art, the specific meanings of the above terms of the present application can be understood according to practical situations.

In the present application, unless explicitly stated and limited, the first feature is "on" or "under" the second feature may refer to that the first feature and second feature are directly contact, or are indirectly through another feature between them. Moreover, the first feature is "above", "upon", and "upper" the second feature, including that the first feature is directly above and obliquely above the second feature refers to that t the first feature is higher in level than the second feature. The first feature is "below", "down", and "under" of the second feature refers to that the first feature is directly below or obliquely below the second feature, or merely refers to that the first feature is horizontally lower than the second feature.

The following application provides many different embodiments or examples for implementing different structures of the present application. To simplify the application of the present application, the components and settings of specific examples are described below. Obviously, these are merely examples instead of limitation of the present application. Furthermore, the present application may repeat reference numbers and/or reference letters in different examples, and such repetition is for the purpose of simplicity and clarity, and does not indicate the relationship between the various embodiments and/or settings. Moreover, the present application provides examples of various specific processes and materials, but the applicability of other processes and/or application of other materials may be appreciated by a person skilled in the art.

The present application provides an organic light-emitting diode (OLED) display panel and a manufacturing method thereof. Refer to FIGS. 1 to 7 for details.

Pad bending is a core technology of the OLED display panels, so major businesses are developing pad bending technology to reduce a width of frames and achieve a greater screen-to-body ratio. Because a bending region of the OLED display panel is provided with a metal wiring layer, when a bending radius of the OLED display panel is relatively small, the metal wiring layer is prone to break or crack. Meanwhile, stress will also be transmitted to a thin-film encapsulation layer of a display region, which makes the display region have a risk of being intruded by water and oxygen. Therefore, the present application provides the OLED display panel and the manufacturing method thereof to solve the above problems.

Refer to FIG. 1, which is a first structural schematic diagram 100 of the OLED display panel provided by an embodiment of the present application. In an embodiment of the present application, the OLED display panel includes a folding region B and a non-folding region C. The folding region B includes a first flexible layer 11, an inorganic layer 12, a second flexible layer 13, a buffer layer 14, a metal wiring layer 16, a planarization layer 17, and a pixel defining layer 18, which are sequentially stacked.

A side of the buffer layer 14 opposite to the second flexible layer 13 is provided with holes. Each of the holes is deposited with a first organic filling layer 15.

The metal wiring layer 16 covers a side of the buffer layer 14 and the first organic filling layer 15. A cross section of the first organic filling layer 15 of the folding region B is formed with a zigzag shape.

Furthermore, the first flexible layer 11 and the second flexible layer 13 are made of polyimide or plastic.

The first organic filling layer 15 with the zigzag shape makes the metal wiring layer 16 become the zigzag shape, so in a neutral layer c, a tooth top and a tooth bottom are respectively subjected to tensile stress and compressive stress, and part of the tensile stress and the compressive stress can offset each other. During a bending process of material, an outer layer is tensioned, an inner layer is compressed, and there is a transition layer on their cross-section that is neither tensioned nor compressed. A normal stress value of each point on an intersection of a cross section of the transition layer and stress planes is almost zero. This transition layer is called the neutral layer of the material, otherwise known as a neutral axis, which is a virtual layer. Risks of generating cracks in the OLED display panel or breakage and short-circuiting of the metal wiring layer extending to the display region of the OLED display panel are reduced, and the display quality of the OLED display panel is prevented from being affected. Refer to a dashed line shown in FIG. 1 for details.

Furthermore, the first organic filling layer 15 is a columnar array having a plurality of columns with same size and shape.

Figure 6:
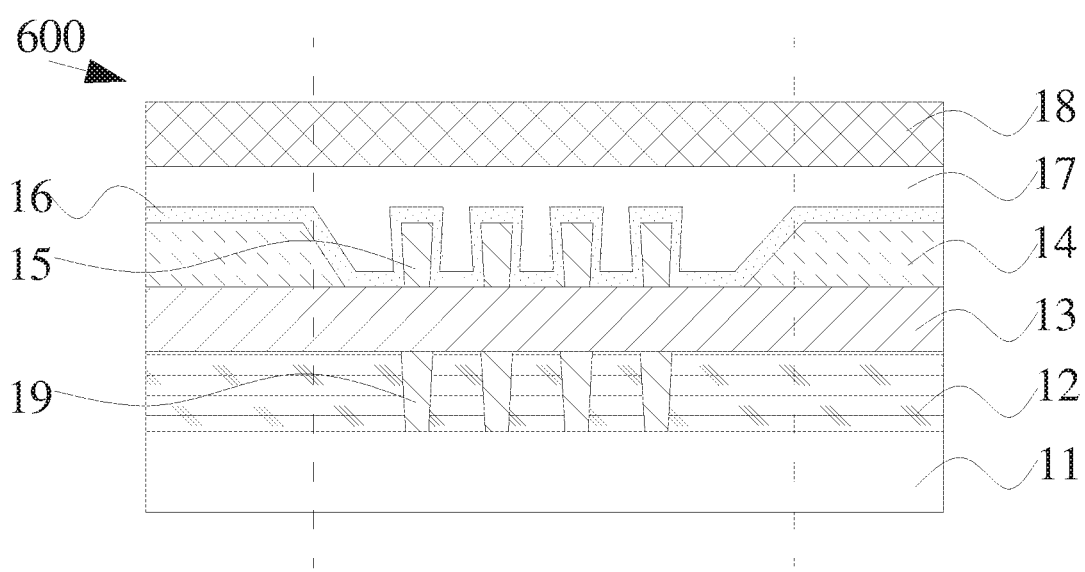
FIG. 6 is a fifth structural schematic diagram of the OLED display panel provided by an embodiment of the present application.

Furthermore, each of the plurality of columns has a cylindrical shape (refer to FIG. 1), an upright truncated cone shape (refer to FIG. 5, which is a fourth structural schematic diagram 500 of the OLED display panel provided by an embodiment of the present application), or an inverted truncated cone shape (refer to FIG. 6, which is a fifth structural schematic diagram 600 of the OLED display panel provided by an embodiment of the present application).

Figure 4:
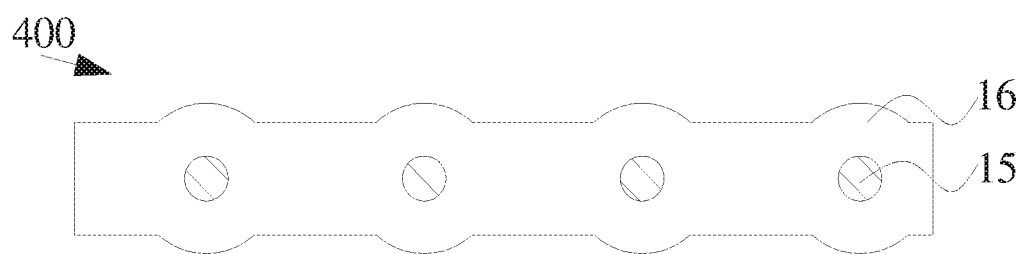
FIG. 4 is a cross-sectional view along a A-A direction of the OLED display panel provided by an embodiment of the present application.
Figure 5:
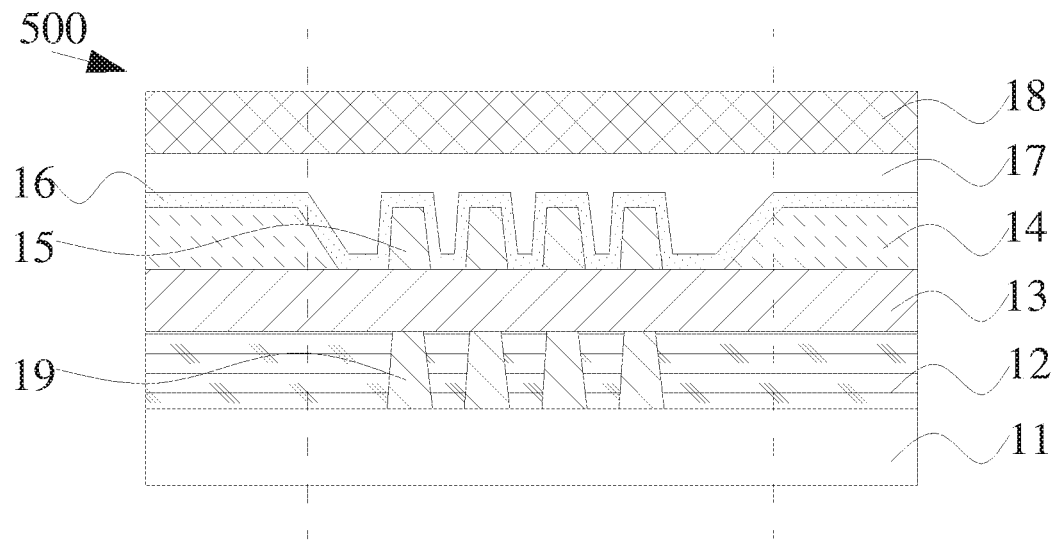
FIG. 5 is a fourth structural schematic diagram of the OLED display panel provided by an embodiment of the present application.

Furthermore, referring to FIG. 1, the metal wiring layer 16 covers an upper surface and a periphery of the first organic filling layer 15. Referring to FIG. 4, which is a cross-sectional view along a A-A direction of the OLED display panel provided by an embodiment of the present application, a projection of the metal wiring layer 16 covering each of the plurality of columns forms a circle. Furthermore, a space with a same layer as the metal wiring layer 16 without metal wires disposed is filled with an inorganic material such as one or a combination of silicon nitride, silicon oxide, and silicon oxynitride.

Furthermore, a surface of the metal wiring layer 16 (a side opposite to the first flexible layer 11) is covered with an optically transparent adhesive. An optically clear adhesive (OCA) is generally adopted, which has characteristics of colorlessness, transparency, light transmittance above 90%, good bonding strength, curing at room temperature or medium temperature, and less curing shrinkage. The OCA is one of important raw materials for touch screens. Optical acrylic adhesive is made into inorganic materials, and then a layer of release film is attached to an upper layer and a lower layer to form a double-sided adhesive tape of the inorganic materials. In an embodiment of the present application, the optically transparent adhesive not only has high resistance to variable stress, but also has a function of forming a protective layer on the surface of the metal wiring layer to reduce damage to the metal wiring layer caused by external water and oxygen.

Figure 2:
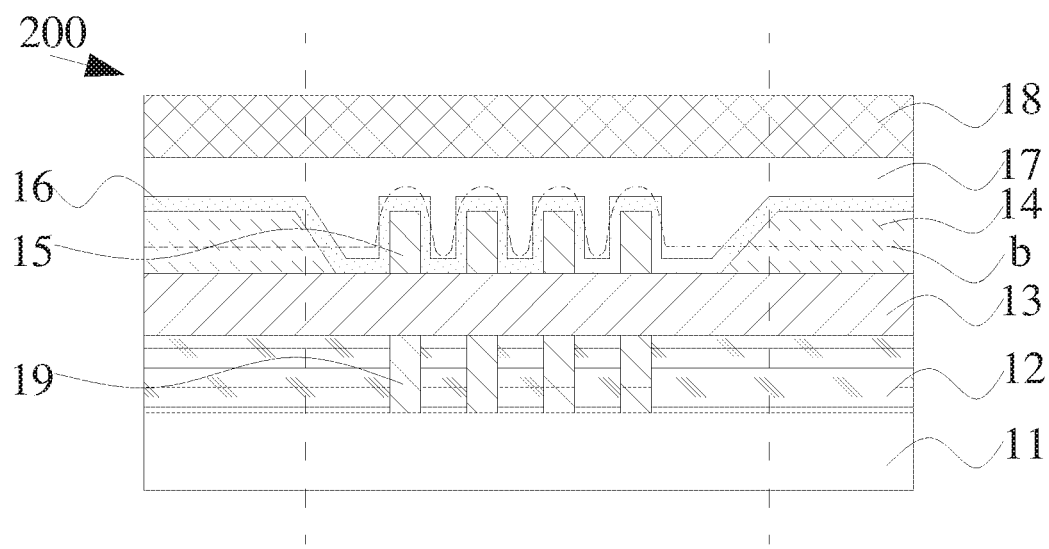
FIG. 2 is a second structural schematic diagram of the OLED display panel provided by an embodiment of the present application.

Refer to FIG. 2, which is a second structural schematic diagram 200 of the OLED display panel provided by an embodiment of the present application. In the above OLED display panel, a side of the inorganic layer 12 opposite to the first flexible layer 11 is provided with holes. Each of the holes is deposited with a second organic filling layer 19. The second organic filling layer 19 is arranged same as the first organic filling layer 15.

Furthermore, referring to FIG. 2, the second organic filling layer 19 is parallel to and face the first organic filling layer 15. When the second organic filling layer 19 is parallel to and face the first organic filling layer 15, the tensile stress and the compressive stress in a neutral layer b have the largest integration degree, and the possibility of cracks or breakage in the folding region extending to the display region is the smallest.

Figure 3:
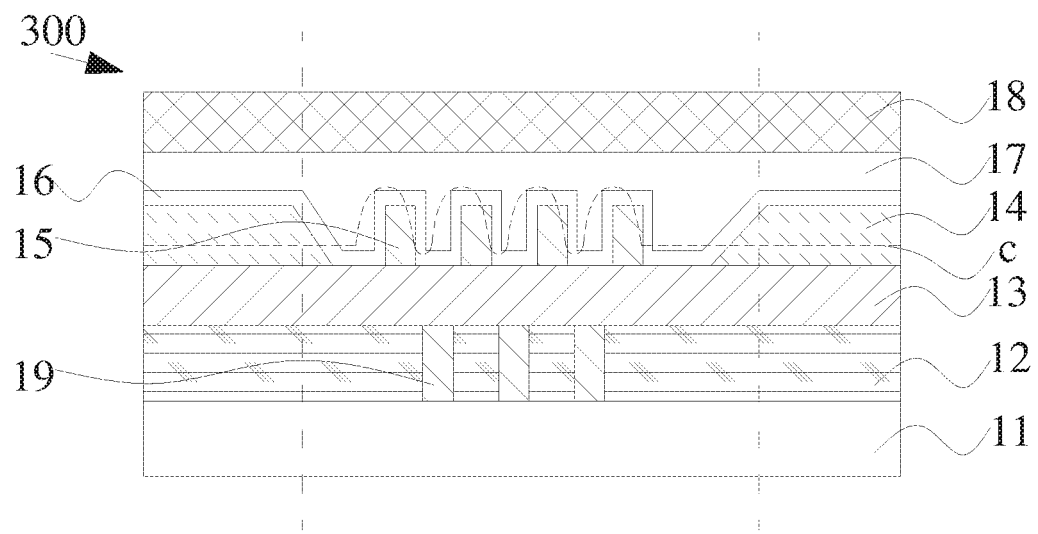
FIG. 3 is a third structural schematic diagram of the OLED display panel provided by an embodiment of the present application.

Furthermore, referring to FIG. 3, which is a third structural schematic diagram of the OLED display panel provided by an embodiment of the present application, the second organic filling layer 19 is parallel to and offset from the first organic filling layer 15. When the second organic filling layer 19 is parallel to and offset from the first organic filling layer 15, the integrated degree of the tensile stress and the compressive stress in the neutral layer c is also relatively large, but slightly smaller than a case that the second organic filling layer 19 is parallel to and face the first organic filling layer 15. Also, a concentrated point of the tensile stress and the compressive stress in the neutral layer c no longer coincides with the tooth top and the tooth bottom of the zigzag shape of the first organic filling layer, so there is a certain deviation.

Similarly, the first organic filling layer 15 with the zigzag shape makes the metal wiring layer 16 become the zigzag shape, so the tooth top and the tooth bottom are respectively subjected to the tensile stress and the compressive stress, and part of the tensile stress and the compressive stress can offset each other, thereby reducing the risks of generating cracks in the OLED display panel or breakage and short-circuiting of the metal wiring layer extending to the display region of the OLED display panel.

Furthermore, material of the inorganic layer is one or a combination of silicon nitride, silicon oxide, and silicon oxynitride.

Furthermore, the planarization layer 17 is disposed on a side of the metal wiring layer 16 opposite to the first flexible layer 11. The pixel defining layer 18 is disposed on a side of the planarization layer 17 opposite to the first flexible layer 11. The pixel defining layer 18 is configured to set various color resists. A side of the pixel defining layer opposite to the first flexible layer is provided with the color resists with a plurality of colors, such as red color resists, green color resists, and blue color resists. Furthermore, yellow color resists or other color resists can be set as long as they meet light-emitting requirements of the OLED display panel.

Figure 7:
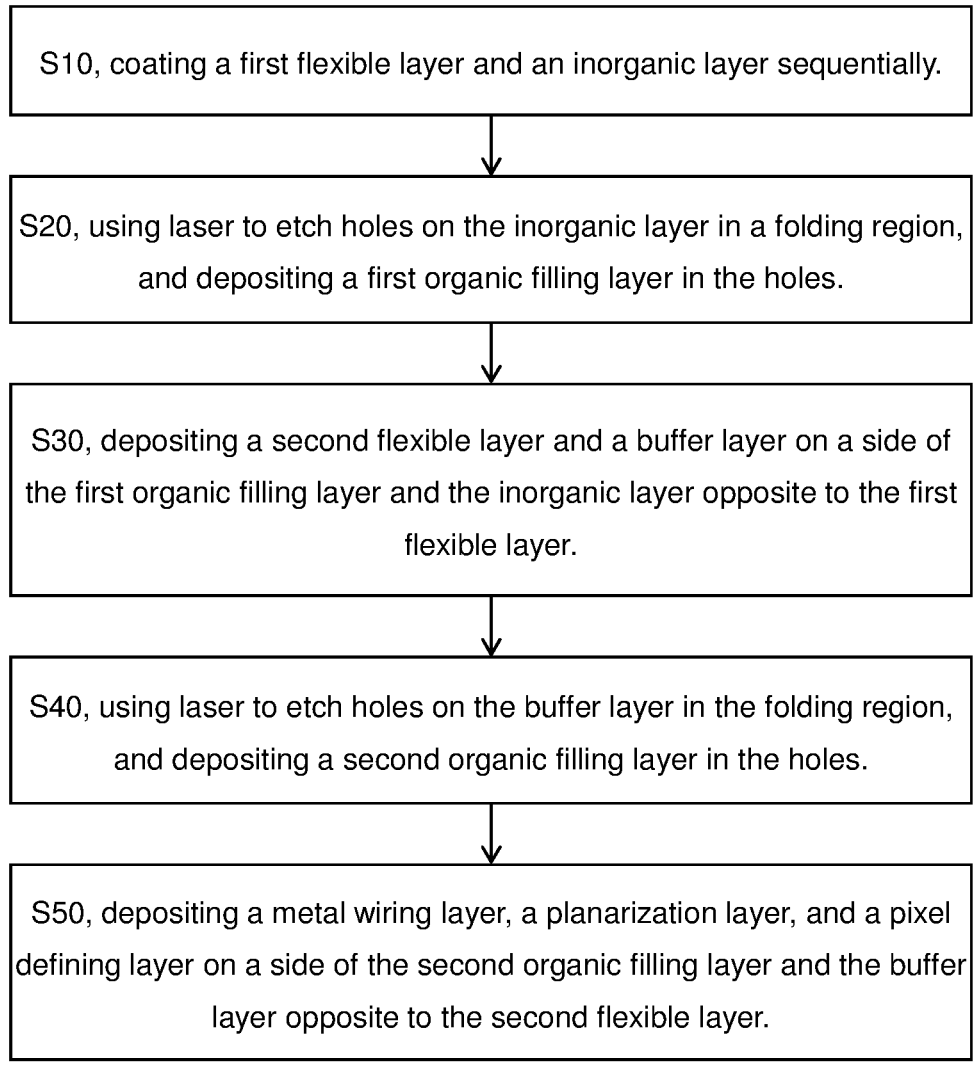
FIG. 7 is a flowchart of a manufacturing method of the OLED display panel provided by an embodiment of the present application.

Refer to FIG. 7, which is a flowchart of a manufacturing method of the OLED display panel provided by an embodiment of the present application. The manufacturing method includes following steps: S10, coating a first flexible layer and an inorganic layer sequentially; S20, using laser to etch holes on the inorganic layer in a folding region, and depositing a first organic filling layer in the holes; S30, depositing a second flexible layer and a buffer layer on a side of the first organic filling layer and the inorganic layer opposite to the first flexible layer; S40, using laser to etch holes on the buffer layer in the folding region, and depositing a second organic filling layer in the holes; and S50, depositing a metal wiring layer, a planarization layer, and a pixel defining layer on a side of the second organic filling layer and the buffer layer opposite to the second flexible layer.

Therefore, the OLED display panel provided by the present application uses laser to etch the holes on the buffer layer, deposits columnar organic filling layers in the holes, and deposits the metal wiring layer on the side of the buffer layer and the organic filling layers opposite to the first flexible layer. Hence, part of tensile stress and compressive stress generated when the metal wiring layer is bent inward offset each other. The risks of generating cracks in the OLED display panel or the breakage and the short-circuiting of the metal wiring layer extending to the display region of the OLED display panel are reduced, and the display quality of the OLED display panel is prevented from being affected. Moreover, the OLED display panel provided by the present application also uses laser to etch the holes on the inorganic layer, and deposits columnar organic filling layers in the holes. Bending stress of the OLED display panel is further reduced, and the display quality of the OLED display panel is prevented from being affected.

The OLED display panel and the manufacturing method thereof provided by embodiments of the present application is described in detail above, and the description of embodiments above is only for helping to understand technical solutions of the present application and its core idea. Understandably, for a person of ordinary skill in the art can make various modifications of the technical solutions of the embodiments of the present application above. However, it does not depart from the scope of the technical solutions of the embodiments of the present application.

What is claimed is:

1. An organic light-emitting diode (OLED) display panel, comprising a folding region and a non-folding region;
wherein the folding region comprises a first flexible layer, an inorganic layer, a second flexible layer, a buffer layer, a metal wiring layer, a planarization layer, and a pixel defining layer, which are sequentially stacked;
wherein a side of the buffer layer away from the second flexible layer is provided with holes, and each of the holes is deposited with a first organic filling layer;
wherein the metal wiring layer covers a side of the buffer layer and the first organic filling layer, and a cross section of the first organic filling layer of the folding region is formed with a tooth shapes; and
wherein a side of the inorganic layer away from the first flexible layer is provided with holes, each of the holes is deposited with a second organic filling layer, and the second organic filling layer is arranged same as the first organic filling layer.

2. The OLED display panel according to claim 1, wherein the first flexible layer and the second flexible layer are made of polyimide or plastic.

3. The OLED display panel according to claim 1, wherein a shape of the metal wiring layer is formed with a zigzag shape.

4. The OLED display panel according to claim 1, wherein the first organic filling layer is a columnar array having a plurality of columns with same size and shape.

5. The OLED display panel according to claim 4, wherein each of the plurality of columns has a cylindrical shape, an upright truncated cone shape, or an inverted truncated cone shape.

6. The OLED display panel according to claim 4, wherein the metal wiring layer covers an upper surface and a periphery of the first organic filling layer.

7. The OLED display panel according to claim 1, wherein a projection of the metal wiring layer covering each of the plurality of columns forms a circle.

8. The OLED display panel according to claim 1, wherein a space with a same layer as the metal wiring layer without metal wires disposed is filled with an inorganic material.

9. The OLED display panel according to claim 8, wherein the inorganic material filled in the space with the same layer as the metal wiring layer without metal wires disposed is one or a combination of silicon nitride, silicon oxide, and silicon oxynitride.

10. The OLED display panel according to claim 1, wherein a side of the metal wiring layer away from the first flexible layer is covered with an optically transparent adhesive.

11. The OLED display panel according to claim 1, wherein the second organic filling layer is parallel to and face the first organic filling layer.

12. The OLED display panel according to claim 1, wherein the second organic filling layer is parallel to and offset from the first organic filling layer.

13. The OLED display panel according to claim 1, wherein material of the inorganic layer is one or a combination of silicon nitride, silicon oxide, and silicon oxynitride.

14. The OLED display panel according to claim 1, wherein the planarization layer is disposed on a side of the metal wiring layer away from the first flexible layer, and the pixel defining layer is disposed on a side of the planarization layer away from the first flexible layer.

15. The OLED display panel according to claim 1, wherein a side of the pixel defining layer away from the first flexible layer is provided with color resists with a plurality of colors.

* * * * *